United States Patent
Konstantinov et al.

(10) Patent No.: US 8,084,813 B2
(45) Date of Patent: Dec. 27, 2011

(54) SHORT GATE HIGH POWER MOSFET AND METHOD OF MANUFACTURE

(75) Inventors: Andrei Konstantinov, Sollentuna (SE);
Christopher Harris, Solna (SE);
Jan-Olov Svedberg, Jarfalla (SE)

(73) Assignee: Cree, Inc., Durham, NC (US)

( * ) Notice: Subject to any disclaimer, the term of this patent is extended or adjusted under 35 U.S.C. 154(b) by 446 days.

(21) Appl. No.: 11/949,221

(22) Filed: Dec. 3, 2007

(65) Prior Publication Data
US 2009/0140326 A1 Jun. 4, 2009

(51) Int. Cl.
*H01L 29/66* (2006.01)

(52) U.S. Cl. ........ 257/330; 257/327; 257/328; 257/329; 257/331; 257/332; 257/335; 257/E29.257; 257/E29.259; 257/E29.26; 257/E29.262; 438/212; 438/268; 438/270

(58) Field of Classification Search ........... 257/E29.001, 257/327–332, 335, E29.257, E29.259, E29.26, 257/E29.262; 438/270, 212, 268
See application file for complete search history.

(56) References Cited

U.S. PATENT DOCUMENTS

| | | | |
|---|---|---|---|
| 4,839,702 A * | 6/1989 | Grinberg et al. | 257/23 |
| 5,283,201 A | 2/1994 | Tsang et al. | |
| 5,637,898 A | 6/1997 | Baliga | |
| 5,814,859 A | 9/1998 | Ghezzo et al. | |
| 5,831,288 A | 11/1998 | Singh et al. | |
| 5,895,939 A * | 4/1999 | Ueno | 257/279 |
| 5,915,180 A | 6/1999 | Hara et al. | |
| 5,923,051 A | 7/1999 | Harris et al. | |
| 6,091,108 A | 7/2000 | Harris et al. | |
| 6,168,695 B1 * | 1/2001 | Woodruff et al. | 204/297.08 |
| 6,259,134 B1 * | 7/2001 | Amaratunga et al. | 257/330 |
| 6,600,192 B1 * | 7/2003 | Sugawara et al. | 257/329 |
| 7,186,618 B2 | 3/2007 | Polzl et al. | |
| 7,586,151 B2 | 9/2009 | Takaya et al. | |
| 2002/0056871 A1 | 5/2002 | Kocon et al. | |
| 2002/0139992 A1 | 10/2002 | Kumar et al. | |
| 2003/0042538 A1 | 3/2003 | Kumar et al. | |
| 2003/0042555 A1 | 3/2003 | Kitada et al. | |
| 2004/0070013 A1 * | 4/2004 | Yamaguchi et al. | 257/288 |
| 2006/0194392 A1 | 8/2006 | Nagaoka | |
| 2006/0199365 A1 | 9/2006 | Wilner | |
| 2007/0190728 A1 | 8/2007 | Sreekantham et al. | |
| 2007/0262324 A1 | 11/2007 | Kaneko | |
| 2008/0179662 A1 | 7/2008 | Hshieh | |

FOREIGN PATENT DOCUMENTS
WO 9736313 10/1997

OTHER PUBLICATIONS
Shinsuke Harada et al., 8.5-m : cm2 600-V Double Epitaxial MOSFETs in 4H-SiC, IEEE Electron Device Letters, vol. 25, No. 5., May 2004.

(Continued)

*Primary Examiner* — Matthew E Warren
*Assistant Examiner* — John Lin
(74) *Attorney, Agent, or Firm* — Withrow & Terranova, P.L.L.C.

(57) ABSTRACT

A short gate high power metal oxide semiconductor field effect transistor formed in a trench includes a short gate having gate length defined by spacers within the trench. The transistor further includes a buried region that extends beneath the trench and beyond a corner of the trench, that effectively shields the gate from high drain voltage, to prevent short channel effects and resultantly improve device performance and reliability.

14 Claims, 14 Drawing Sheets

OTHER PUBLICATIONS

Ranbir Singh et al., Development of High-Current 4H-SiC ACCUFET, IEEE Transactions on Electron Devices, vol. 50, No. 2, Feb. 2003.

Y. Li, J.A. Cooper, Jr., Fellow, IEEE, and M.A. Capano; High-Voltage (3 kV) UMOSFETs in 4H-SiC; IEEE Transactions on Electron Devices, vol. 49, No. 6, Jun. 2002; pp. 972-975.

* cited by examiner

SHORT GATE HIGH POWER MOSFET AND METHOD OF MANUFACTURE

STATEMENT OF GOVERNMENT INTEREST

The present invention was developed with Government support under contract number FA8650-04-2-2410 awarded by the U.S. Air Force. The Government has certain rights in this invention.

BACKGROUND OF THE INVENTION

1. Field of the Invention

The present invention relates to a short gate high power MOSFET, and a method of making a short gate high power UMOSFET.

2. Description of the Background Art

In silicon carbide (SiC) MOSFETs (metal oxide semiconductor field effect transistor), inversion channel mobility is dramatically lower than in silicon based MOSFETs. The relatively poor inversion channel mobility is due in large part to the gate oxidation process, whereby a rough interface between the gate oxide and the underlying silicon carbide is formed. Defects which occur at the gate oxide/silicon carbide interface due to the rough interface reduce channel mobility.

A common approach to improving inversion channel mobility of silicon carbide MOSFETs focuses on reducing channel length, so that the distance traveled by carriers within the inversion channel underneath the gate is as short as possible. However, a problem encountered with this approach is that as channel length is reduced, breakdown voltage of the MOSFET device becomes limited. If the channel length is too short, the channel may open responsive to a high voltage applied to the drain even without a necessary voltage applied to the gate, to thus force the device into an on state when it should be off. This is commonly referred to as a short-channel effect, or an early turn-on effect. A need thus exists to protect the channel of the device from excessive drain voltage, so as to prevent short channel effects such as the early turn-on effect. Key aspects of short channel MOSFET design thus include limiting the impact of low channel mobility by reducing the length of the conduction path at the MOS interface, while at the same time preventing short-channel effects.

SUMMARY OF THE INVENTION

In accordance with a first embodiment, a semiconductor device includes in combination a substrate of a first conductivity type; a region of a second conductivity type within the substrate, the region extending from an upper surface of the substrate into the substrate, the second conductivity type opposite the first conductivity type; a first layer of the first conductivity type over the substrate and the region; a trench extending into the first layer, a bottom of the trench is within the first layer and a portion of the first layer is intermediate between the bottom of the trench and the region; a gate having gate sections over the portion of the first layer at the bottom of the trench and covering sidewalls of the trench, a central area of the portion of the first layer at the bottom of the trench exposed between the gate sections; an insulating layer covering an upper surface of the first layer and the gate sections, and within the trench covering the central area of the portion of the first layer at the bottom of the trench; and a source contact overlying the insulating layer, the source contact extending through the insulating layer and the central area of the portion of the first layer at the bottom of the trench, to contact the central area of the portion of the first layer at the bottom of the trench and the region.

In accordance with another embodiment, a vertical field effect transistor includes in combination a first layer of a first conductivity type; an implanted region of a second conductivity type extending into the first layer, the second conductivity type opposite the first conductivity type; a second layer of the first conductivity type on an upper surface of the first layer and an upper surface of the implanted region; a trench extending into the second layer above the implanted region, a portion of the second layer is disposed intermediate between a bottom of the trench and the implanted region, the implanted region extending laterally beyond sidewalls of the trench; a gate having gate sections within the trench and covering the sidewalls of the trench, a central area of the portion of the second layer at the bottom of the trench is exposed between the gate sections; an insulating layer covering the second layer and the gate sections, and within the trench; a source contact overlying the insulating layer, the source contact extending through the insulating layer within the trench and the central area of the portion of the second layer at the bottom of the trench, to contact the implanted region and the second layer; and a drain contact on a bottom surface of the first layer, the bottom surface on a side of the first layer opposite the upper surface.

In accordance with a further embodiment, a method of manufacturing a semiconductor device includes in combination forming a first region in a substrate of a first conductivity type, the first region extending from an upper surface of the substrate into the substrate and having a second conductivity type that is opposite the first conductivity type; forming a first layer of the first conductivity type over the substrate and the first region; forming a trench extending into the first layer, a bottom of the trench is within the first layer and a portion of the first layer is intermediate between the bottom of the trench and the first region; forming a gate having gate sections over the portion of the first layer at the bottom of the trench and covering sidewalls of the trench, a central area of the portion of the first layer at the bottom of the trench is exposed between the gate sections; forming an insulating layer covering an upper surface of the first layer and the gate sections, and within the trench covering the central area of the portion of the first layer at the bottom of the trench; and forming a source contact overlying the insulating layer, the source contact extending through the insulating layer and the central area of the portion of the first layer at the bottom of the trench, to contact the central area of the portion of the first layer at the bottom of the trench and the first region.

In accordance with a still further embodiment, a method of manufacturing a vertical field effect transistor includes in combination providing a first layer of a first conductivity type; implanting a first region of a second conductivity type in the first layer, the second conductivity type being opposite the first conductivity type; forming a second layer of the first conductivity type on an upper surface of the first layer and an upper surface of the implanted region; forming a trench extending into the second layer above the implanted region, a portion of the second layer is disposed intermediate between a bottom of the trench and the first region, the first region extending laterally beyond sidewalls of the trench; forming a gate having gate sections within the trench and covering the sidewalls of the trench, a central area of the portion of the second layer at the bottom of the trench is exposed between the gate sections; forming an insulating layer covering the second layer and the gate sections, and within the trench; forming a source contact overlying the insulating layer, the source contact extending through the insulating layer within the trench and through the central area of the portion of the second layer at the bottom of the trench, to contact the implanted region and the second layer; and forming a drain contact on a bottom surface of the first layer, the bottom surface on a side of the first layer opposite the upper surface.

BRIEF DESCRIPTION OF THE DRAWINGS

The above and other objects and features of the present invention will become apparent from the following description of the preferred embodiments made in connection with the accompanying drawings, in which.

DETAILED DESCRIPTION OF THE PREFERRED EMBODIMENTS

Figure 1:
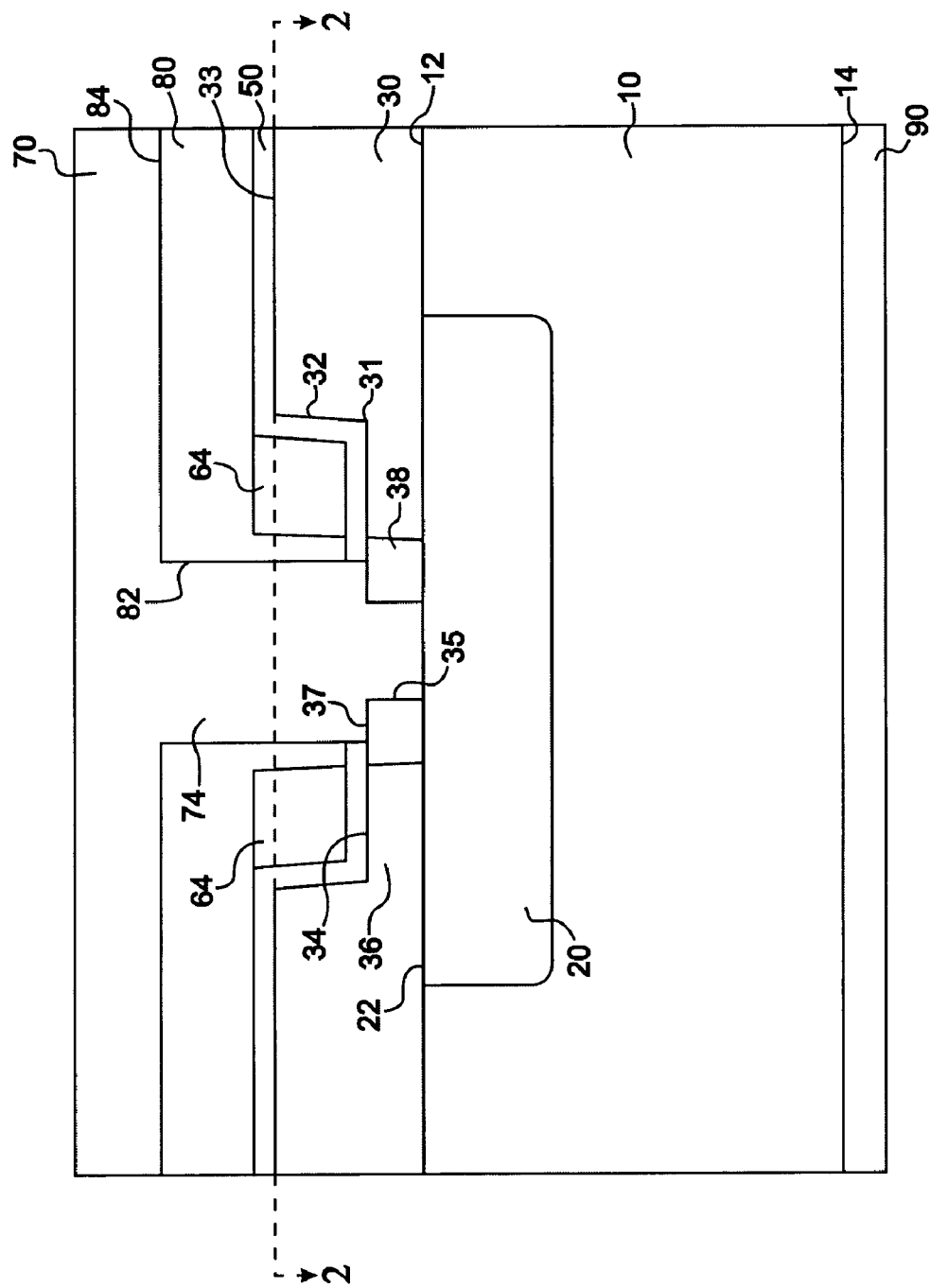
FIG. 1 illustrates a cross-section of a structure of an embodiment along line 1-1 shown in FIG. 2.

The present invention will now be described more fully hereinafter with reference to the accompanying drawings, in which preferred embodiments of the invention are shown. This invention may however be embodied in many different forms and should not be construed as limited to the embodiments set forth herein. Rather, the embodiments as described are provided so that this disclosure will be thorough and complete, and will fully convey the concept of the invention to those skilled in the art. In the drawings, the shape and thickness of the elements and layers may be exaggerated for clarity, and are not necessarily drawn to scale. Also, like reference numbers are used to refer to like elements throughout the application. Description of well known methods and materials are omitted. Also, this application may include aspects or features described in copending application Ser. No. 11/855,595, which is hereby incorporated by reference in its entirety.

Figure 2:
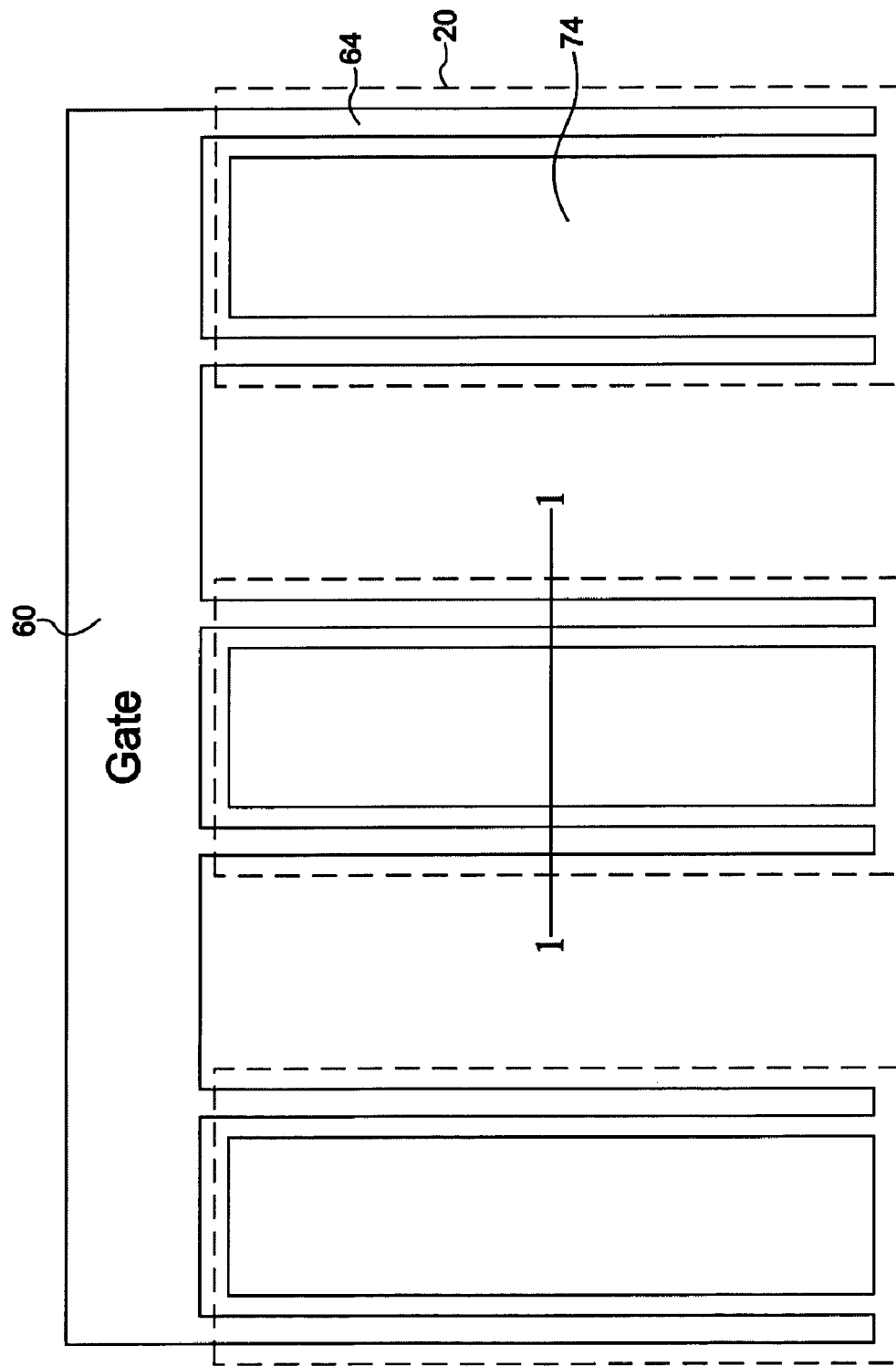
FIG. 2 illustrates a plan view of the structure along sectional line 2-2 shown in FIG. 1.

FIG. 1 is a cross-sectional view and FIG. 2 is a plan view of a semiconductor device of an embodiment of the present invention. The cross-sectional view in FIG. 1 is taken along sectional line 1-1 shown in FIG. 2. The plan view of FIG. 2 is taken along sectional line 2-2 shown in FIG. 1.

As shown in FIG. 1, substrate 10 includes a first main or upper surface 12 and a second main or bottom surface 14 opposing first main surface 12. First and second main surfaces 12 and 14 may be characterized as front and back sides of substrate 10, whereby devices are disposed on or over first main surface 12. In this embodiment as described, substrate 10 is silicon carbide (SiC) having n-type conductivity and a thickness of about 300 to 500 μm, or about 400 μm. More particularly, although not shown in detail, substrate 10 includes an uppermost epilayer having a thickness in a range of about 5 μm-30 μm and a dopant concentration of at least about $10^{15}/cm^3$. The epilayer is disposed on a base substrate having a standard thickness of at least 350 μm and a high dopant concentration of at least about $10^{19}/cm^3$. Substrate 10 may be doped with an n-type impurity such as nitrogen or phosphorous. Substrate 10 however should not necessarily be limited as silicon carbide, or as having n-type conductivity, but may be other materials such as silicon or gallium nitride (GaN). Moreover, as noted above, substrate 10 should not necessarily be limited as a single epitaxial layer on a single base substrate layer of silicon carbide or other substrate material, but may in general be a growth substrate with plural epitaxial layers grown thereon.

As further shown in FIG. 1, p-type region 20 is shown as extending from upper surface 12 of substrate 10, into substrate 10. Region 20 may have a thickness or depth in the vertical or y-direction or about 0.4 μm, and may be doped with a p-type impurity such as aluminum, boron or beryllium. Region 20 may have a dopant profile that is graded in a vertical or y-direction, as having a dopant concentration of at least about $10^{18}/cm^3$ near upper surface 22, and a somewhat lower dopant concentration of at least about $10^{16}/cm^3$ near the bottom of region 20. As should be understood in view of FIG. 2, region 20 extends along the z-direction. Incidentally, it should be understood that grading of the dopant concentration enables shaping of the depletion profile, which can help limit the depletion of channel regions between neighboring regions 20, to thus optimize resistance. However, region 20 should not necessarily be limited as having a dopant profile that is graded in the vertical direction, but may have a substantially uniform dopant concentration.

As further shown in FIG. 1, n-type silicon carbide layer 30 is disposed on an entirety of upper surface 12 of substrate 10, and also covering upper surface 22 of region 20. Layer 30 may be epitaxially grown, and may have a total thickness of at least about 0.7 μm. More particularly, although not shown in detail, layer 30 may consist of multilayers to have a dopant profile that is graded in the vertical or y-direction. For example, layer 30 may include a first sublayer having a dopant concentration of about $10^{16}/cm^3$ and a thickness of about 0.2 μm on substrate 10 and region 20, and a second sublayer having a dopant concentration of about $10^{17}/cm^3$ and a thickness of about 0.5 μm on the first sublayer. However, layer 30 should not necessarily be limited as merely having two sublayers as described, but may in general be a single growth layer of substantially uniform dopant concentration, or may consist of more than two sublayers. The doping concentration and profile of layer 30 will determine the threshold characteristics of the device. A too high concentration or a too thick layer will result in a device with normally-on characteristics.

Layer 30 in FIG. 1 includes a first trench 32 in an upper portion thereof over region 20, extending from upper surface 33 of layer 30, whereby trench bottom 34 of first trench 32 is within layer 30. Portion 36 of layer 30 is intermediate or between trench bottom 34 of first trench 32 and upper surface 22 of region 20. First trench 32 includes trench corner 31. A narrow second trench 35 extends from trench bottom 34 of first trench 32 through intermediate portion 36 of layer 30, and exposes upper surface 22 of region 20. Second trench 35 is in a substantially central region of trench 32. Layer 30 further includes n+-type source contact area 38 disposed within intermediate portion 36 as extending from trench bottom 34 of first trench 32 to upper surface 22 of region 20, and as immediately surrounding second trench 35. Source contact area 38 may have a dopant concentration of at least about $10^{19}/cm^3$. Although not particularly shown in the plan view of FIG. 2, first and second trenches 32 and 35 and source contact area 38 extend along the z-direction.

The structure shown in FIG. 1 also includes a pair of gate sections 64 disposed over trench bottom 34 at peripheral areas of first trench 32, as covering respective sidewalls of first trench 32. In this embodiment, gate sections 64 are polysilicon having a thickness in the vertical or y-direction of about 0.5 μm, and may be doped with boron or aluminum. Gate oxide 50 having a thickness in a range of about 50-100 nm is disposed as on an entirety of upper surface 33 of layer 30, the sidewalls of first trench 32, and portions of trench bottom 34 of first trench 32. Gate oxide 50 is intermediate between gate sections 64 and layer 30. It should be understood that gate sections 64 are disposed as having minimal overlap with source contact area 38.

As further shown in FIG. 1, field dielectric 80 such as silicon nitride is disposed over the entirety of the substrate, particularly as over gate oxide 50 and gate sections 64. Field dielectric 80 may have a thickness in the vertical or y-direction of about 1 μm. Source contact 70 having a thickness of about 1 μm is disposed over the entirety of upper surface 84 of field dielectric 80, and includes extension 74 that extends through via 82 within field dielectric 80 to be in contact with upper surface 37 of source contact area 38, and through second trench 35 to be in contact with upper surface 22 of region 20. Source contact 70 may be a multilayer including a nickel or titanium layer stacked on an aluminum layer. In the alternative, source contact 70 may be a single layer of titanium, aluminum or other materials, or a multilayer having more than two layers. The structure also includes drain contact 90 on lower or second surface 14 of substrate 10. Drain contact 90 may also be a multilayer including a nickel or titanium layer stacked on an aluminum layer, but may in the alternative be a single layer of nickel, titanium, or other materials, or a multilayer having more than two layers. Also, field dielectric 80 may be other materials such as silicon dioxide, instead of silicon nitride.

As shown in the plan view of FIG. 2, gate 60 includes gate sections 64 which extend along the z-direction shown in FIG. 1. Extension 74 of source contact 70 extends downward in the vertical or y-direction between gate sections 64 to be in contact with first contact area 38 and region 20. That is, main gate contact 60 includes multiple gate sections 64 (which may hereinafter be referred to as gate contact fingers), and main source contact 70 includes multiple source contact extensions 74 (which may hereinafter be referred to as source contact fingers). Gate contact fingers 64 and source contact fingers 74 extend substantially parallel with respect to each other along the z-direction. As noted previously, first and second trenches 32 and 35 (not shown in FIG. 2) also extend along the z-direction, substantially along the entire length of gate contact fingers 64 and source contact fingers 74. Multiple regions 20 are shown by dotted lines in FIG. 2, and are disposed respectively under a pair of gate contact fingers 64 and a corresponding source contact finger 74. As may be appreciated in view of FIG. 2, each region 20 extends widthwise underneath a corresponding first trench 32 (not shown) along the horizontal or x-direction substantially beyond the corresponding gate contact fingers 64 and the corresponding corners 31 of the first trench 32. Regions 20 are disposed in a grid-like manner, and also extend lengthwise in the z-direction under the first and second trenches 32 and 35. The semiconductor device as shown in FIG. 1 may thus be disposed as part of a multi-cell MOSFET design.

It should be understood that even though only three corresponding sets of gate contact fingers 64 and source contact finger 74 with corresponding regions 20 are shown in FIG. 2, the number of respective sets of gate contact fingers 64 and source contact finger 74 should not be limited as shown in FIG. 2. Such a grid MOSFET device may include various multiple contact fingers and regions 20 within the spirit and scope of the invention. Also, it should be understood that the shape of main gate contact 60, the shape of regions 20, and the distances between source contact fingers 74 and gate contact fingers 64 may be exaggerated for clarity. Also, for the sake of clarity, gate oxide 50 and field dielectric 80 are not shown in FIG. 2.

Operation of the semiconductor device of this embodiment will now be described hereinafter with reference to FIG. 1. As described previously, to reduce the impact of poor channel mobility, the device is designed to have a very short gate length in the horizontal or x-direction, particularly in a range of about 0.3 μm to 1.5 μm. However, in order to realize such a short channel region, the gate must be protected from high electric fields that result from high drain voltages. In this embodiment, the device is protected from such high electric fields by region 20.

In detail, upon application of a positive potential to gate sections 64 shown in FIG. 1 through gate contact 60, an inversion layer is formed in intermediate portion 36 (which may hereinafter be referred to as a channel) under gate sections 64. The inversion layer within channel 36 carries current from source contact area 38 as applied from source contact 70, substantially in the horizontal or x-direction over region 20. The current subsequently flows in the vertical or y-direction through substrate 10 out drain contact 90. The device operates as a vertical MOSFET. The inversion layer is generated at both lateral sides of second trench 35 within channel 36, so that current flows from source contact 70 through layer 30 along both the left and right sides of second trench 35. During such a normal on-state as described, there is minimal potential drop within the device and the associated electric field is minimal.

To turn off the device of FIG. 1, a ground or negative potential is applied to gate sections 64, the value of which depends on the threshold of the device. As a result, carriers (electrons) are not attracted to the interface between channel 36 and gate oxide 50 under gate sections 64. The inversion layer within channel 36 thus no longer exists, and vertical flow of current across channel 36 thus stops.

In a conventional MOSFET structure of trench design that does not include a buried region such as region 20 as shown in FIG. 1 of the present application, immediately after the device is turned off by application of ground or negative potential to the gate, a large potential is present at the drain contact and a relatively low or zero potential is present at the source contact. Under such conditions, a high electric field is concentrated at the corners of the trench of the conventional MOSFET. The high electric field stresses the gate oxide within the trench, resulting in the occurrence of short channel effects and/or device failure.

In the semiconductor device of the embodiment in FIG. 1 of the present application, region 20 limits the electric field that penetrates to corner 31 of trench 32. In greater detail, at trench corner 31 of first trench 32, the MOSFET transitions from an on state with steady flow of electrons and very little potential difference across the device vertically, to an off state where suddenly the supply of electrons across channel 20 has been turned off. When the MOSFET is turned off, the supply of electrons is removed. The depletion region begins to extend along intermediate portion 36, with an associated potential drop across this corresponding region. As the depletion region extends laterally in the horizontal or x-direction, the potential drop increases such that in the off-state, the full applied potential is dropped across the device. However, region 20 in the device of FIG. 1 separates gate sections 64 from the highest electric field. The majority of the potential drop is taken up between region 20 and drain contact 90. If region 20 was not present, there would be a large potential drop between gate sections 64 and drain contact 90. This would result in a high electric field at corner 31 of first trench 32. However, because region 20 is present in the structure shown in FIG. 1 and is tied to a low potential at source contact 70, a large potential drop does not exist between gate sections 64 and upper surface 22 of region 20, and thus the electric field present at trench corner 31 is relatively low. There is a larger potential drop between the bottom of region 20 and drain contact 90, resulting in a relatively larger electric field therebetween. However, this relatively larger electric field is shielded from trench corner 31 by region 20. Region 20 can thus be characterized as splitting the potential realized across the structure.

A method of making a semiconductor device as shown in FIGS. 1 and 2 will now be described with respect to FIGS. 3-14. It should be understood that this description will be presented with reference to cross-sections of the device taken along section line 1-1 in FIG. 2. Moreover, this description follows wherein the semiconductor layers are silicon carbide, substrate 10 and layer 30 have n-type conductivity, and region 20 has p-type conductivity. However, one of ordinary skill should understand that the semiconductor layers may be other materials such as silicon noted previously for example, and that conductivity type may be reversed. The description that follows thus should not be construed as limiting.

Figure 3:
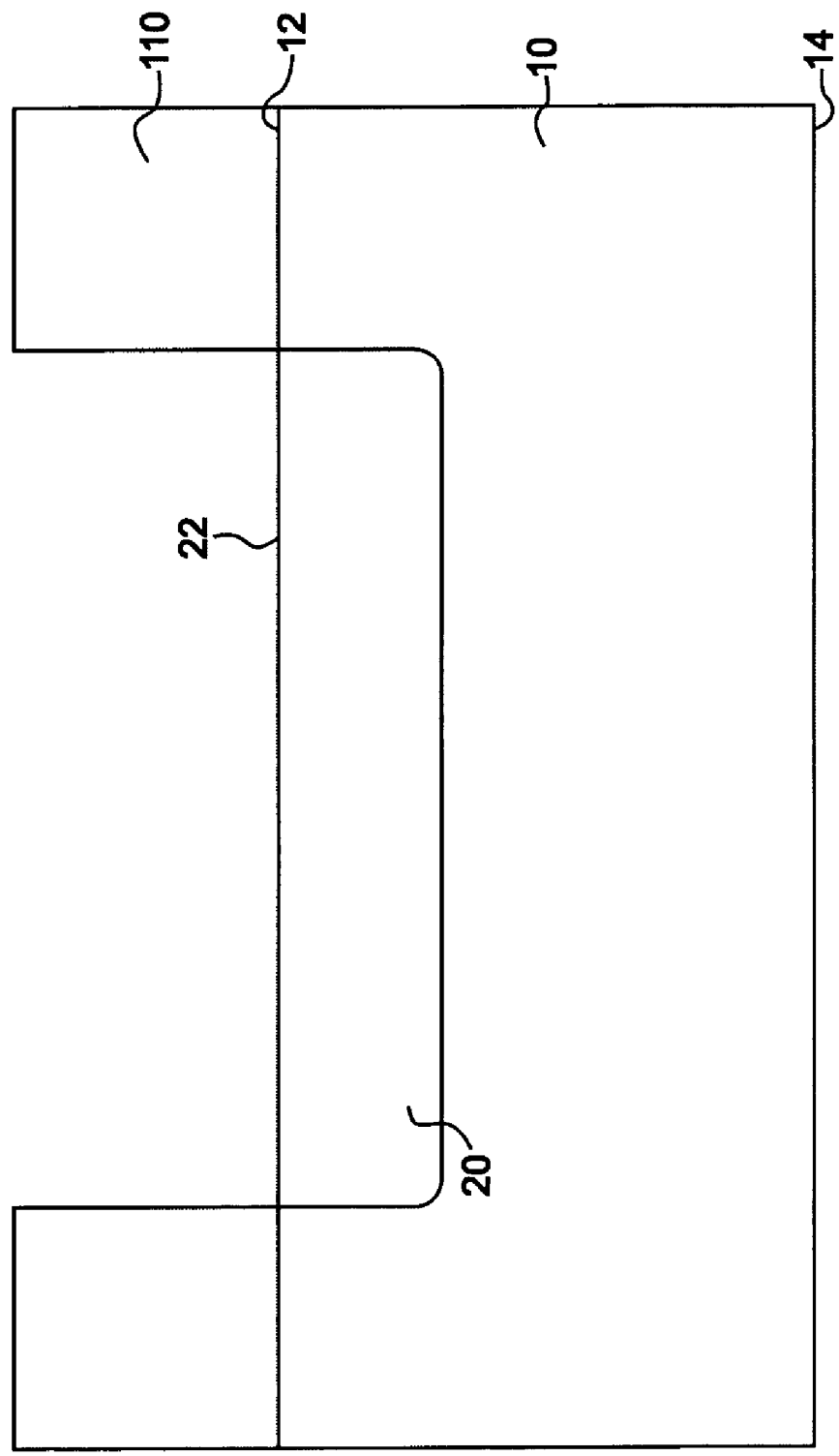
FIG. 3 illustrates a cross-section of the structure after formation of an implanted region.

With reference to FIG. 3, although not shown in detail and as described previously, silicon carbide substrate 10 is provided as including an epilayer on a base substrate, The epilayer has a thickness in a range of about 5 µm-30 µm with a dopant concentration in a range of at least about $10^{15}/cm^3$. The base substrate has a standard thickness of at least about 350 µm with a dopant concentration in a range of at least $10^{19}/cm^3$. The epilayer thickness and dopant concentration are selected based on the blocking voltage desired for the device. The epilayer may be epitaxially grown on the base substrate using well known techniques such as metal organic chemical vapor deposition (MOCVD) to form substrate 10, which is shown in FIG. 3 as including upper surface 12 and an opposite bottom surface 14. Nitrogen or phosphorous may be used as the n-type dopants.

To form p-type region 20, an oxide layer is first deposited on upper surface 12 of substrate 10 using a plasma enhanced chemical vapor deposition (PECVD) or a low pressure CVD (LPCVD) process. The oxide layer is then patterned using well-known photolithography to form oxide mask 110 as shown in FIG. 3. Ion implantation is then carried out using oxide mask 110 to form p-type region 20 within substrate 10. Region 20 may be formed as having a depth of about 0.4 µm from upper surface 12 of substrate 10. Aluminum, boron or beryllium may be used as the p-type dopant. Ion implantation may be carried out so that region 20 may have a dopant profile that is graded in the vertical or y-direction. For example, although not shown in FIG. 3, an upper portion of region 20 may have a dopant concentration of at least about $10^{18}/cm^3$, and a lower portion of region 20 may have a dopant concentration of at least about $10^{16}/cm^3$. Subsequent ion implantation, the structure is annealed at a temperature of about 1600° C. for about at least 5 minutes for example, to activate the impurities implanted therein. Mask 110 is subsequently removed.

Figure 4:
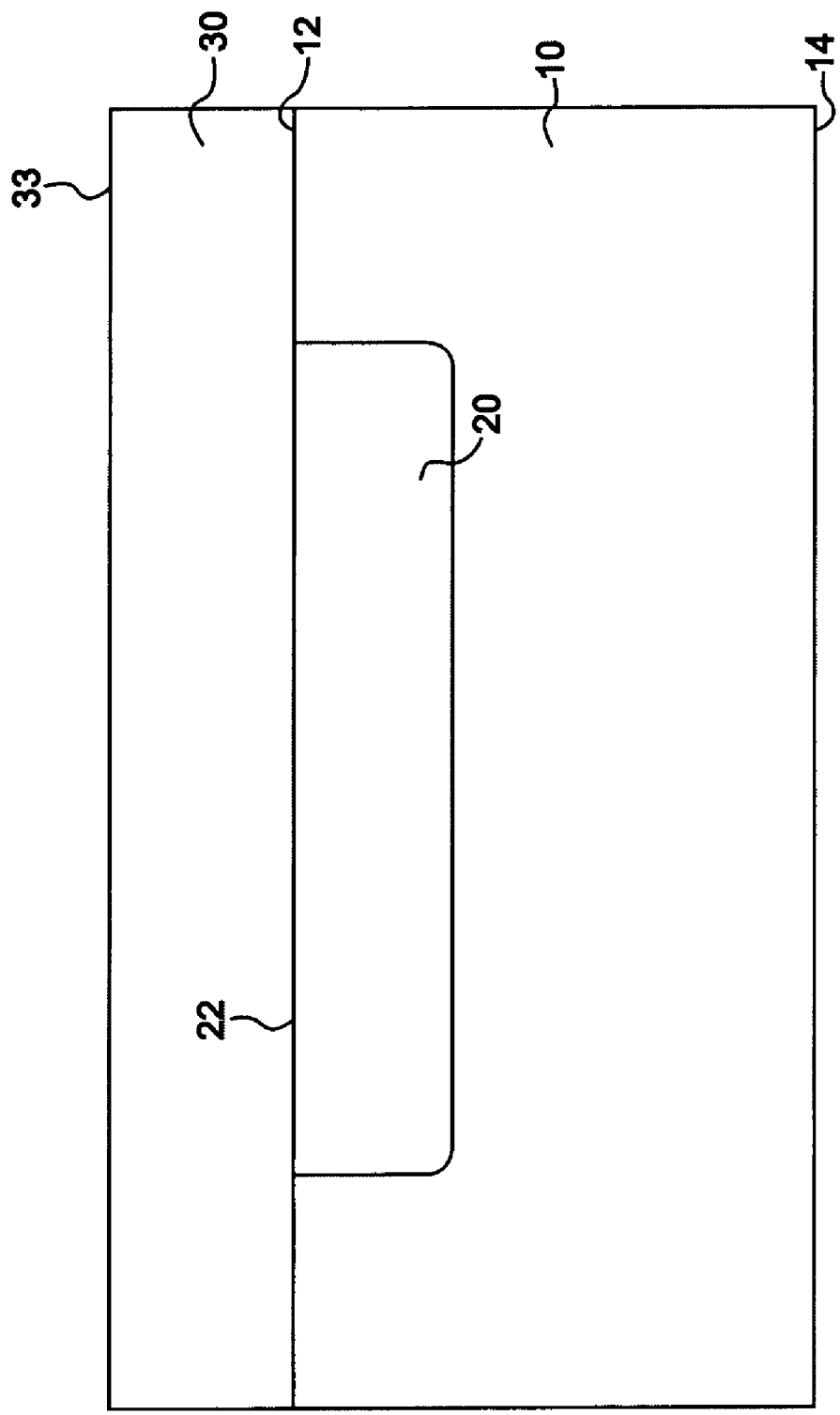
FIG. 4 illustrates a cross-section of the structure after formation of another layer over the implanted region.

Referring to FIG. 4, after removal of mask 110 shown in FIG. 3, n-type layer 30 having upper surface 33 is epitaxially regrown on the upper part of the structure by MOCVD for example, as particularly on upper surface 12 of substrate 10 and upper surface 22 of region 20. Layer 30 may be epitaxially regrown to have a dopant profile that is graded in the vertical or y-direction. For example, although not shown in detail in FIG. 4, layer 30 may be epitaxially grown to have a total thickness of about 0.7 µm, as including a first sublayer on substrate 10/region 20 that has a dopant concentration of about $10^{16}/cm^3$ and a thickness of about 0.2 µm, and a second sublayer that has a dopant concentration of about $10^{17}/cm^3$ and a thickness of about 0.5 µm on the first sublayer. It should be understood that the respective thicknesses and dopant concentrations of the sublayers are exemplary only, and may be selected according to design preference. Moreover, although described as having a graded dopant profile in view of the sublayers, layer 30 may in the alternative be epitaxially regrown as having substantially uniform concentration.

Figure 5:
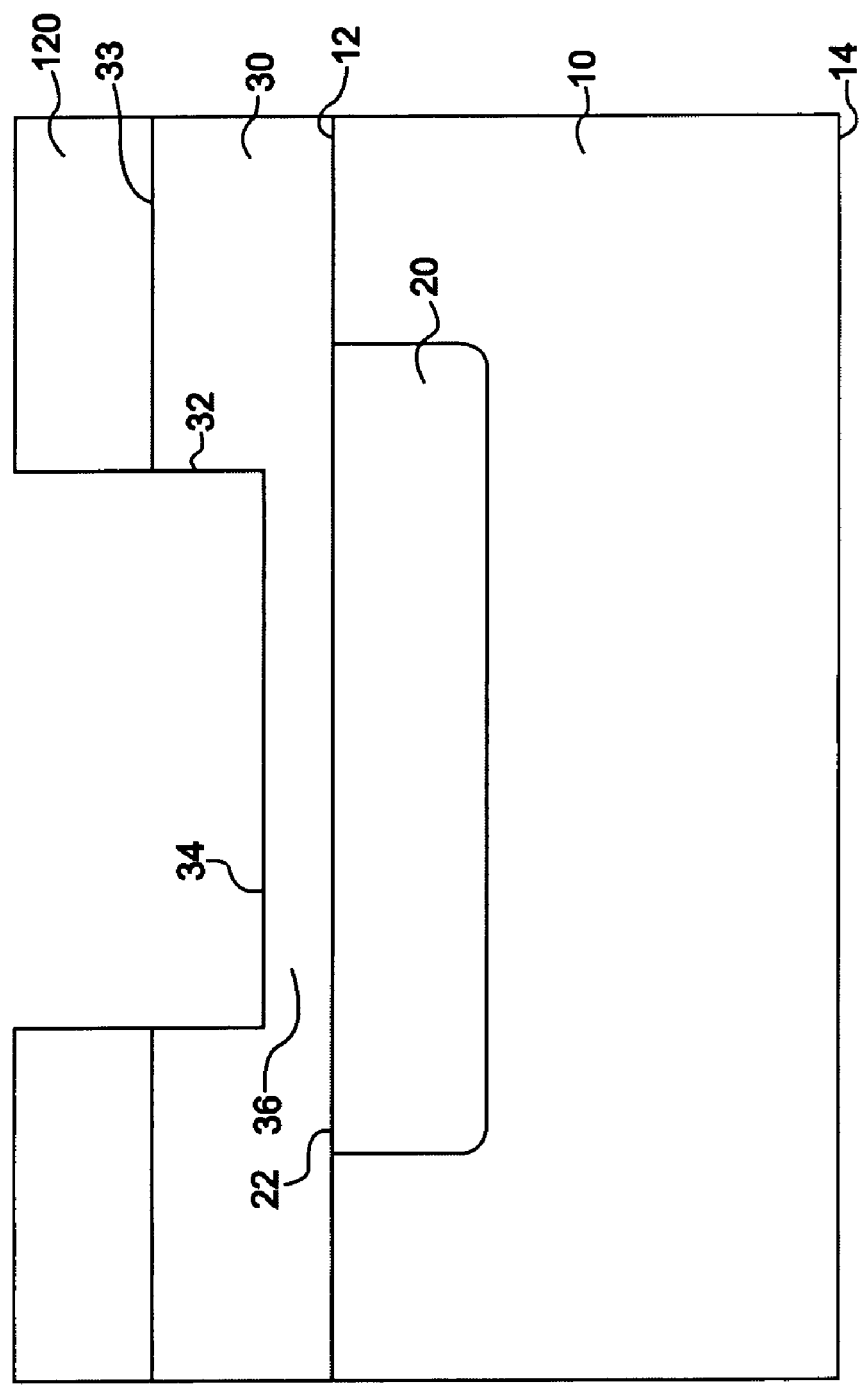
FIG. 5 illustrates a cross-section of the structure after etching of a trench into the another layer.

Referring to FIG. 5, subsequent epitaxial regrowth of layer 30 shown in FIG. 4, an oxide layer is deposited on upper surface 33 of layer 30 by MOCVD for example. The oxide layer is patterned using well-known photolithography to form oxide mask 120 that exposes a portion of upper surface 33 of layer 30 above region 20. Layer 30 is subsequently etched using mask 120 and a dry etching technique such as reactive ion etching (RIE), to form first trench 32 having trench bottom 34 within layer 30. First trench 32 may have a depth of about 0.5 µm from upper surface 33 of layer 30 to trench bottom 34 for example. As shown, intermediate portion 36 of layer 30 remains between trench bottom 34 and upper surface 22 of region 20. Subsequent to the etching, ion implantation is carried out using mask 120, to set the final n-type dopant concentration of intermediate portion 36 that will form the channel under gate sections 64 shown in FIG. 1. This final dopant concentration of intermediate portion 36 that will be disposed under gate sections 64 is set to about $5 \times 10^{16}/cm^3$. The concentration accuracy achieved using implantation is superior to epitaxy, and the ability to adjust the final doping level in region 36 by implantation allows very accurate control of the threshold voltage of the device.

Figure 6:
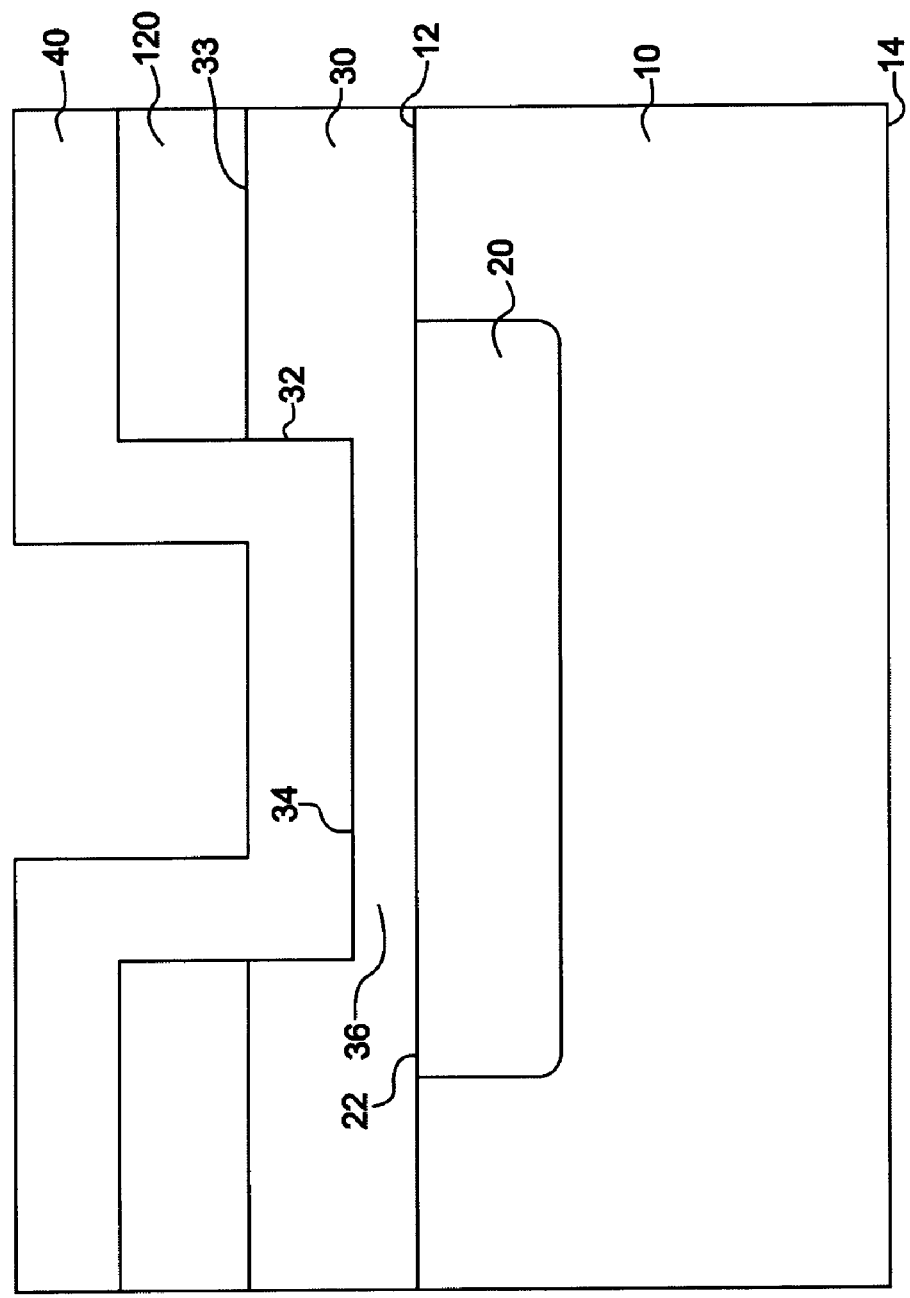
FIG. 6 illustrates a cross-section of the structure after formation of a spacer layer.

With reference to FIG. 6, after the ion implantation as described with respect to FIG. 5, a silicon nitride layer 40 is regrown on the entirety of the structure using well-known techniques such as Plasma Enhanced Chemical Vapor Deposition (PECVD). As shown, silicon nitride layer 40 covers the upper surface of oxide mask 120, the side surfaces of oxide mask 120 above first trench 32, and the sidewalls and trench bottom 34 of first trench 32. The thickness of layer 40 will determine the final active channel length and is chosen according to the high voltage design of the device. For example, layer 40 may have a thickness of about 0.3 to 1.5 microns. Alternative dielectric materials (such as silicon dioxide) may be used dependent on the required implantation profile.

Figure 7:
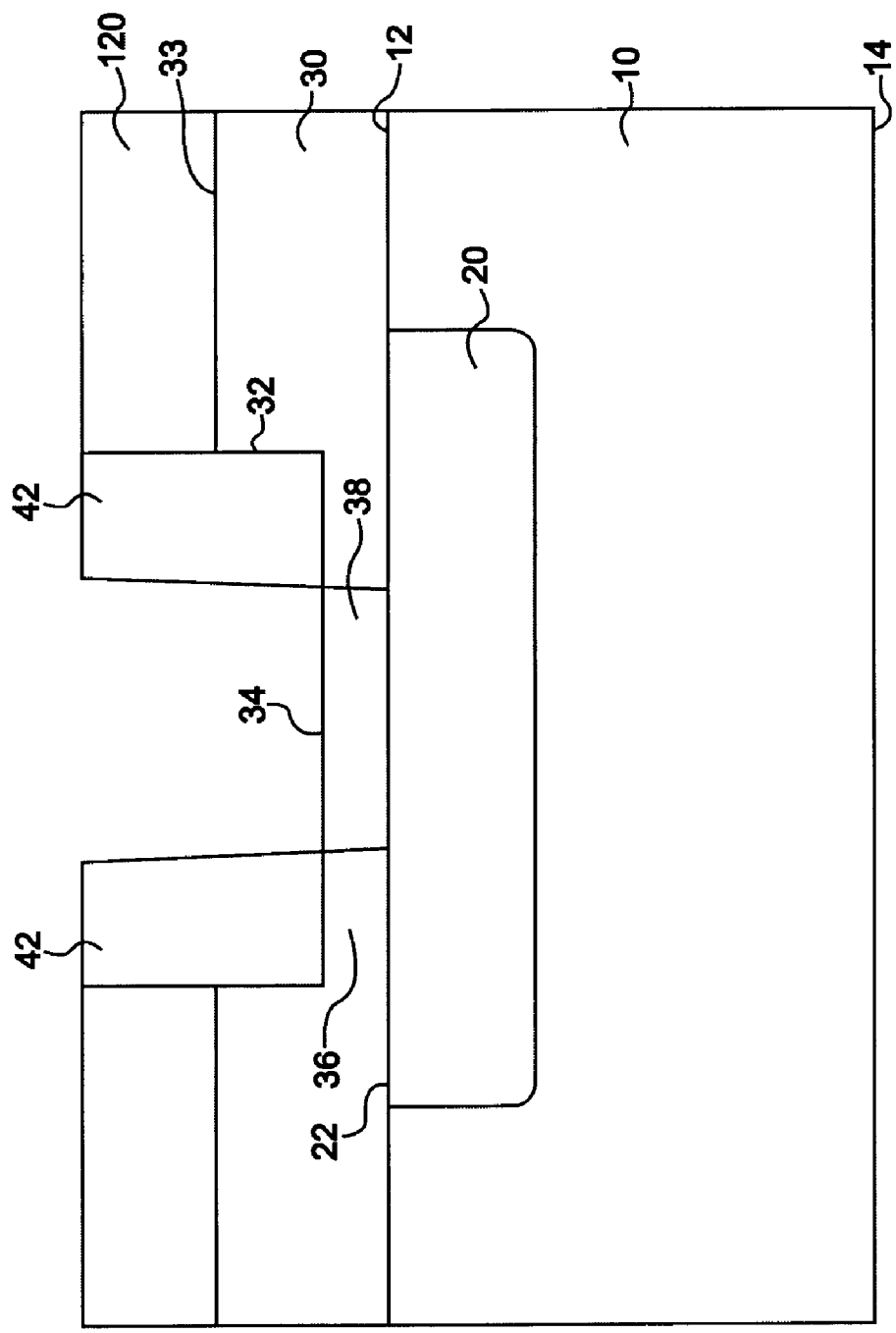
FIG. 7 illustrates a cross-section of the structure after removal of the spacer layer to form spacers and after formation of a source contact region.

With reference to FIG. 7, after formation of silicon nitride layer 40 as shown in FIG. 6, layer 40 is anisotropically etched using an RIE process, to remove portions of layer 40 from the upper surface of oxide mask 120 and from a central region of trench bottom 34. Due to the anisotropic nature of the etch, portions 42 of layer 40 remain as spacers covering the side surfaces of oxide mask 120 and the sidewalls of first trench 32, and on peripheral portions of trench bottom 34 near the sidewalls of first trench 32. Thereafter, another n$^+$-type ion implantation is carried out using spacers 42 and oxide mask 120, to form n$^+$-type source contact area 38 within layer 30 below the central region of trench bottom 34 between spacers 42. The dopant concentration of source contact area 38 is at least about $10^{19}/cm^3$.

It should be understood that the above noted etching of silicon nitride layer 40 to form spacers 42 as described with respect to FIG. 7 defines the gate length of gate sections 64 shown in FIG. 1. That is, the gate length of gate sections 64 in FIG. 1 is bounded by source contact area 38, whereby the extent of source contact area 38 in the horizontal or x-direction is very accurately controlled by the growth and subsequent anisotropic etching of silicon nitride layer 40. The gate length is thus defined by the growth of layer 40, so that a short gate length in a range of about 0.3 to 1.5 µm that would otherwise be less easily achieved using standard photolithography techniques used in power device manufacture.

Figure 8:
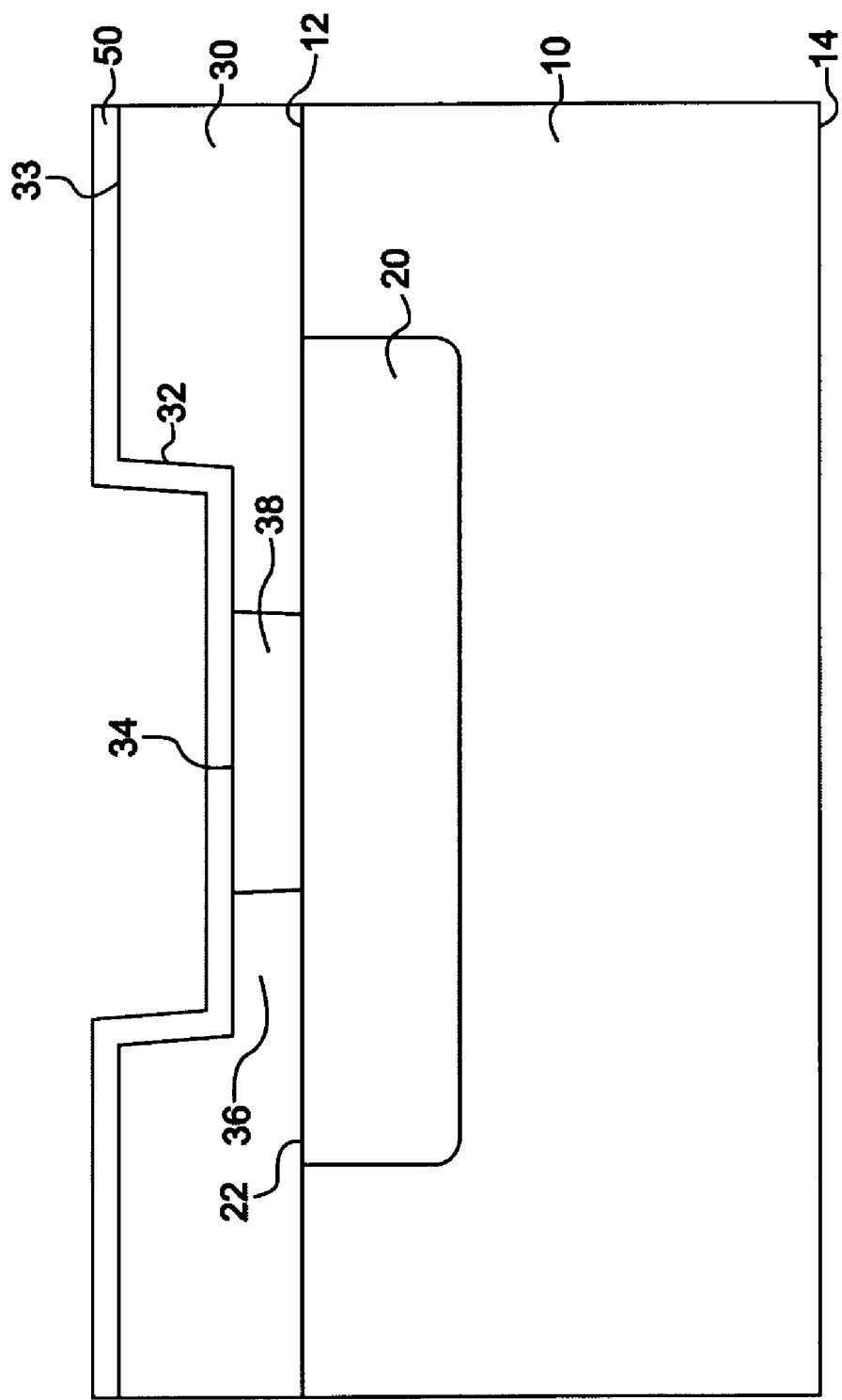
FIG. 8 illustrates a cross-section of the structure after formation of a gate oxide layer.

With reference to FIG. 8, after the implantation as described with respect to FIG. 7, spacers 42 and oxide mask 120 are removed by wet etching using hydrofluoric acid for example. The structure is then annealed at a low temperature of at least about 1200° C. to activate the impurities within source contact area 38. Thereafter, gate oxide 50 having a thickness in a range of about 50-100 nm is grown by thermal oxidation at a temperature greater than about 1000° C. Gate oxidation 50 covers an entirety of the structure as shown in FIG. 8, as particularly on upper surface 33 of layer 30, on the sidewalls of first trench 32, and on trench bottom 34. Gate oxide 50 thus covers both intermediate portion (channel) 36 and source contact area 38. A post-oxidation anneal in nitrous oxide (NO or $N_2O$) may be carried out to improve oxide quality. Alternatively a combination of thin thermally grown oxide may be combined with a deposited gate oxide formed using a technique such as Low Pressure Chemical Vapor Deposition (LPCVD).

Figure 9:
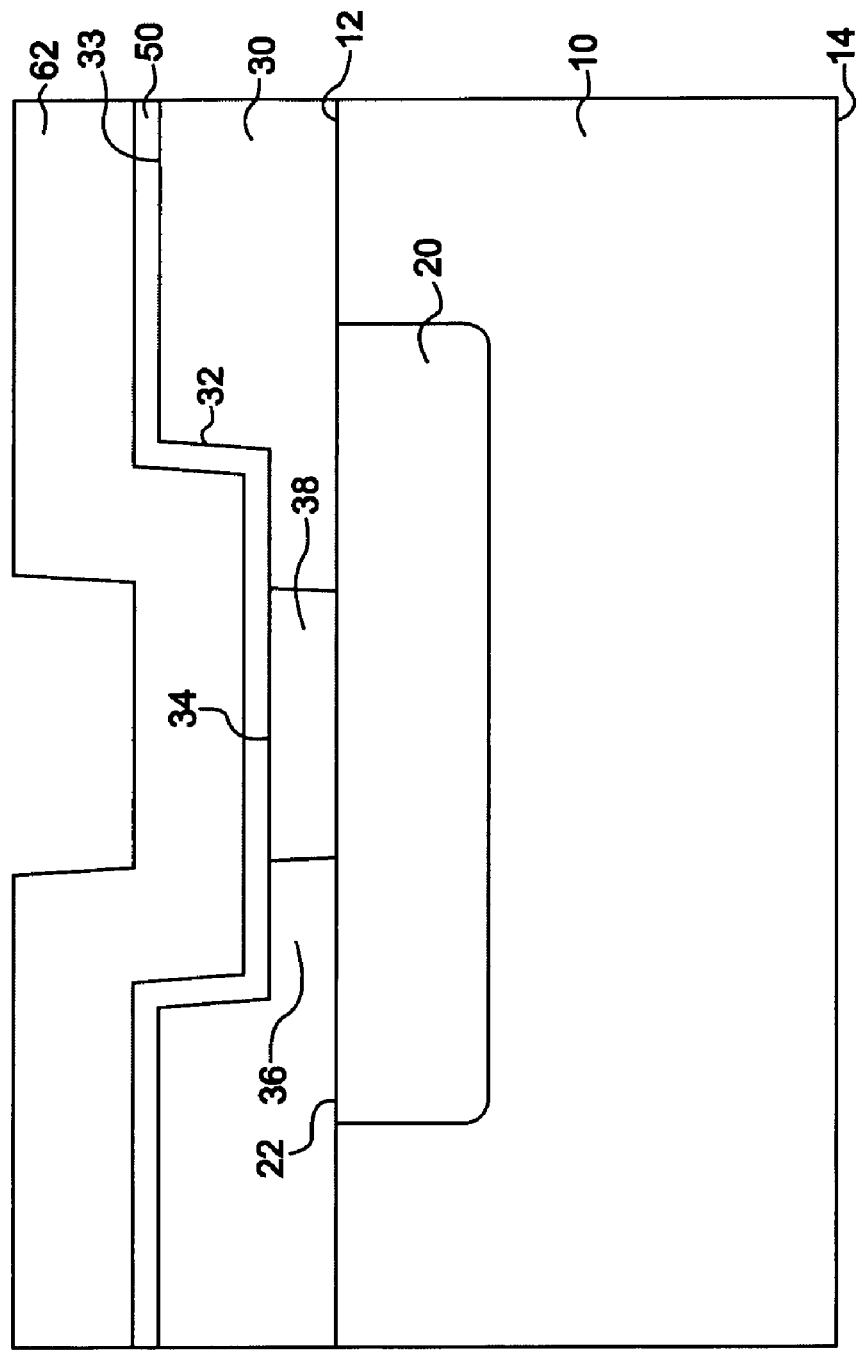
FIG. 9 illustrates a cross-section of the structure after formation of a gate layer.

With reference to FIG. 9, after formation of gate oxide 50 as described with respect to FIG. 8, a gate layer 62 that may be polycrystalline silicon having a thickness corresponding to the chosen channel length, i.e. largely equal to or greater than that of the silicon nitride later 40, is deposited on the entirety of gate oxide 50 using an LPCVD process at a temperature of about 650° C. Gate layer 62 may be doped using boron or aluminum.

Figure 10:
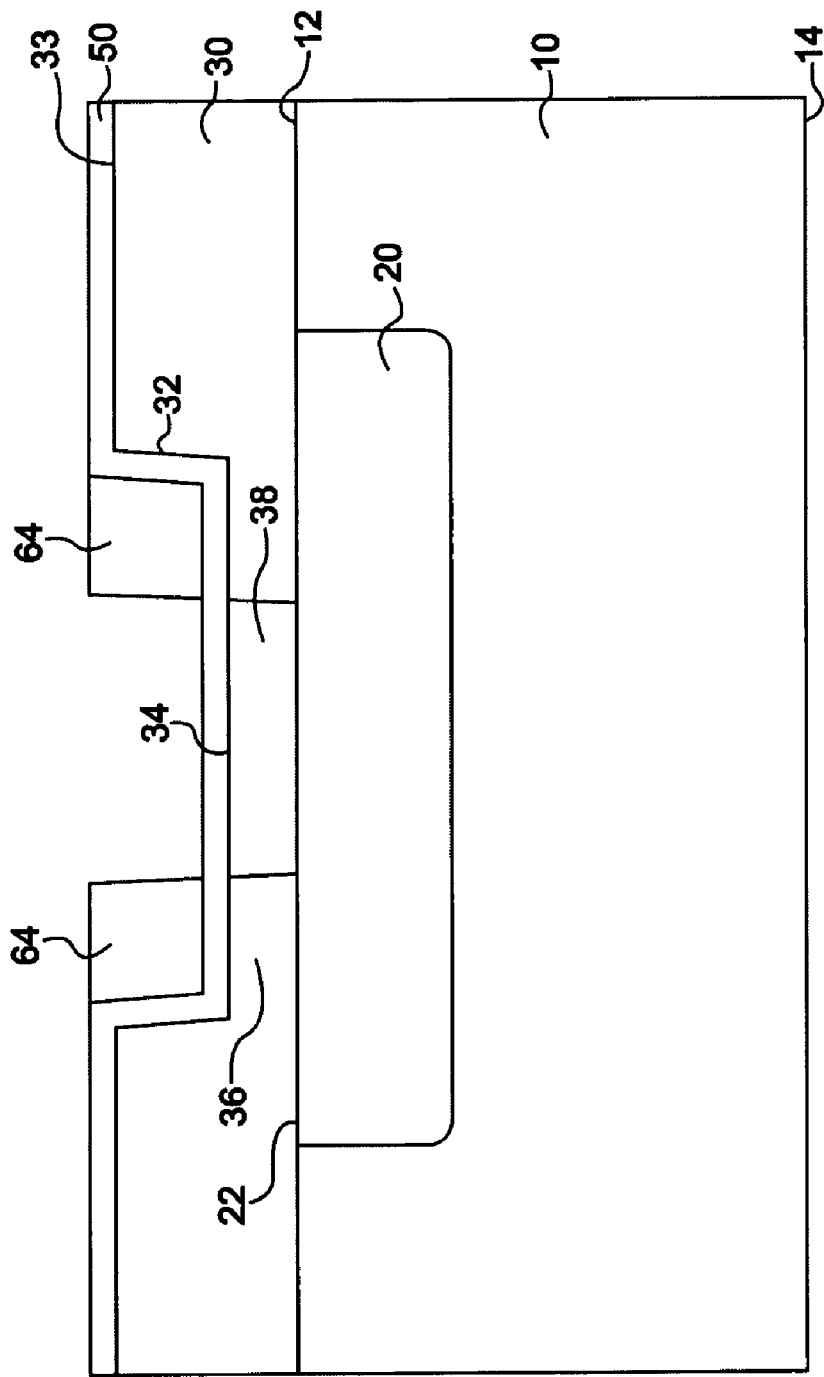
FIG. 10 illustrates a cross-section of the structure after removal of the gate layer to form a gate including gate sections.

With reference to FIG. 10, after formation of gate layer 62 shown in FIG. 9, gate layer 62 is anisotropically etched using an RIE process, to remove portions of gate layer 62 from the top of gate oxide 50 above upper surface 33 of layer 30, and from the central region of trench bottom 34 above source contact area 38. Due to the anisotropic nature of the etch, portions of gate layer 62 remain as gate sections 64 on gate oxide 50 covering side surfaces of first trench 32 and over peripheral portions of trench bottom 34 near the sidewalls of first trench 32. Gate sections 64 respectively have a gate length in the vertical or x-direction in a range of about 0.3 to 1.5 µm.

Figure 11:
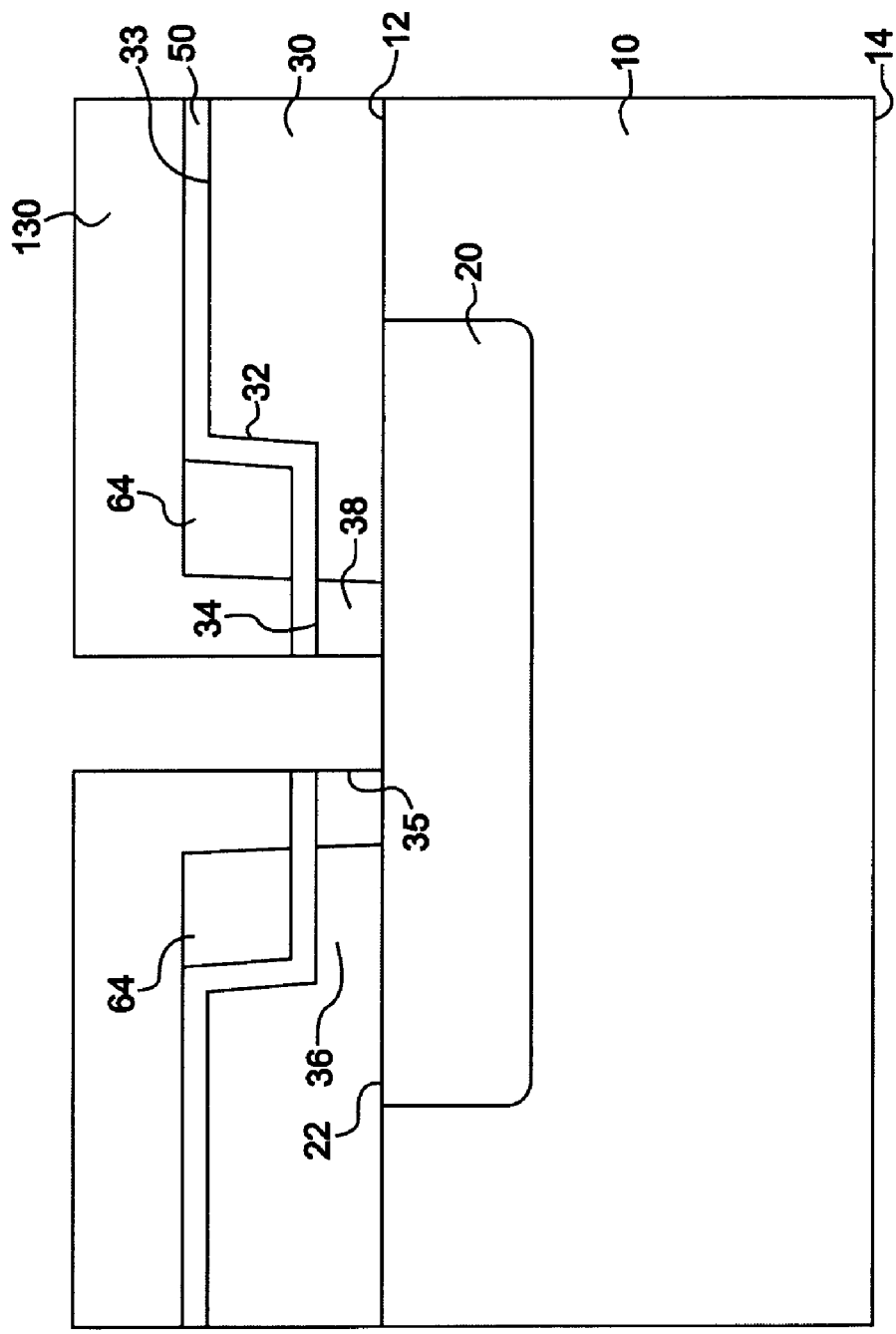
FIG. 11 illustrates a cross-section of the structure after etching to expose the implanted layer.

With reference to FIG. 11, after etching as described with respect to FIG. 10, a resist layer is subsequently formed over the entirety of the structure, particularly as on gate oxide 50 over upper surface 33 of layer 30, on gate sections 64, and on gate oxide 50 within first trench 32 over source contact area 38. The resist layer is subsequently patterned using well-known photolithography, to form resist mask 130 having a narrow opening that exposes gate oxide 50 on trench bottom 34 over source contact area 38. A dry etch such as RIE is subsequently carried out using resist mask 130 to etch and remove exposed gate oxide 50, and to etch and remove source contact area 38 under the removed portion of gate oxide 50. A narrow second trench 35 is thus formed through gate oxide 50 and source contact area 38, to expose upper surface 22 of region 20. Resist mask 130 is subsequently removed.

Figure 12:
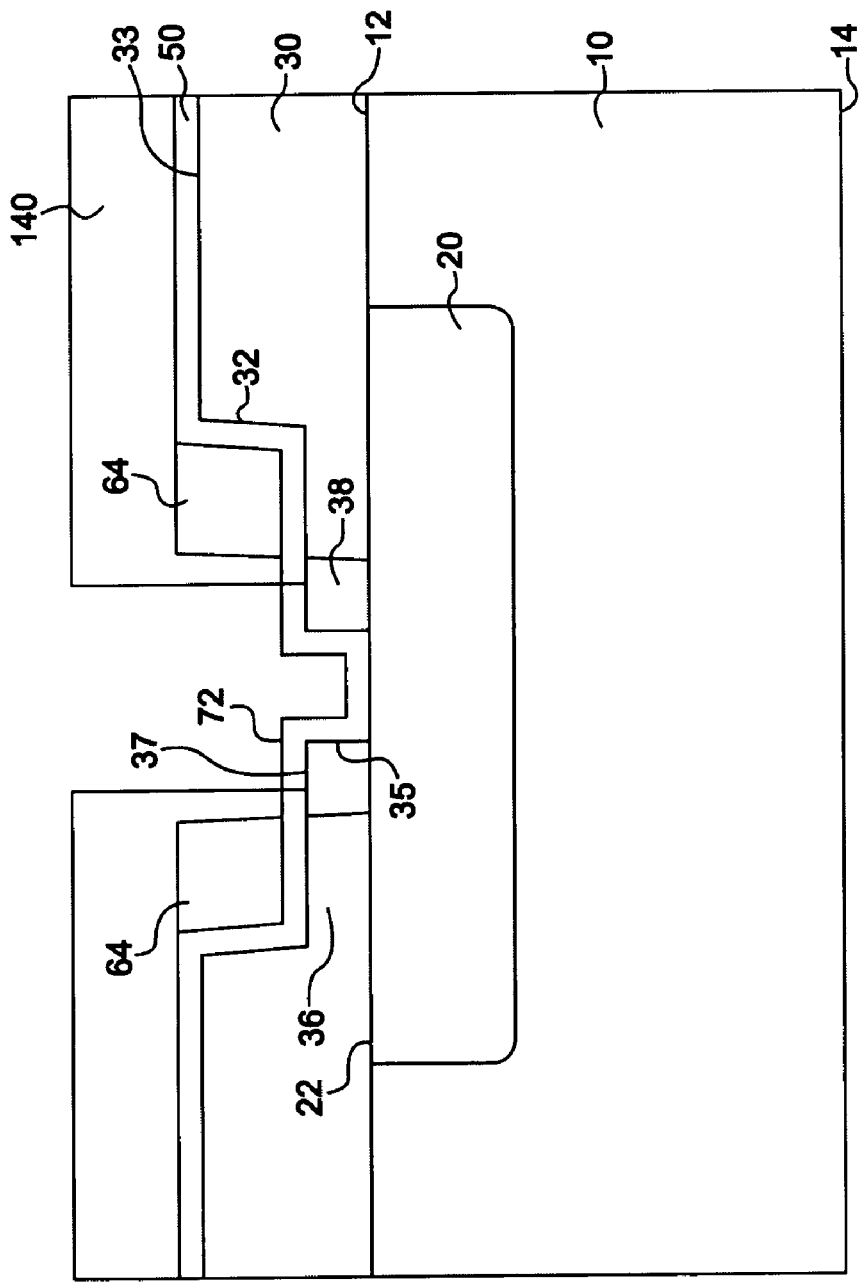
FIG. 12 illustrates a cross-section of the device after formation of a source contact layer on the implanted region.

With reference to FIG. 12, after removal of resist mask 130 shown in FIG. 11, another resist layer is subsequently formed on the entirety of the structure, as particularly on gate oxide 50 over upper surface 33 of layer 30, on gate sections 64, within first trench 32 on gate oxide 50, and within second trench 35 on upper surface 22 of region 20. This resist layer is subsequently patterned using well-known photolithography, to form resist mask 140 which includes a narrow opening that exposes upper surface 22 of region 20 and portions of gate oxide 50 over source contact area 38. A very short, controlled etch is subsequently carried out using resist mask 140, to remove exposed gate oxide 50 over source contact area 38. Thus, upper surfaces 37 of source contact area 38 are exposed for subsequent contact metallization. The resist mask is subsequently used in a "lift-off" process whereby a thin layer of metal such as nickel or titanium tungsten having a thickness of about 100 nm is deposited onto upper surfaces 37 of source contact area 38, and within second trench 35 on upper surface 22 of region 20. A thin layer of metal such as nickel or titanium tungsten having a thickness of about 100 nm (not shown in FIG. 12) is also deposited onto the back-surface 14 of the substrate 10, as a preliminary drain contact layer. The structure is then annealed at a temperature of 950° C. to form ohmic metal contact 72. Resist mask 140 is thereafter removed.

Figure 13:
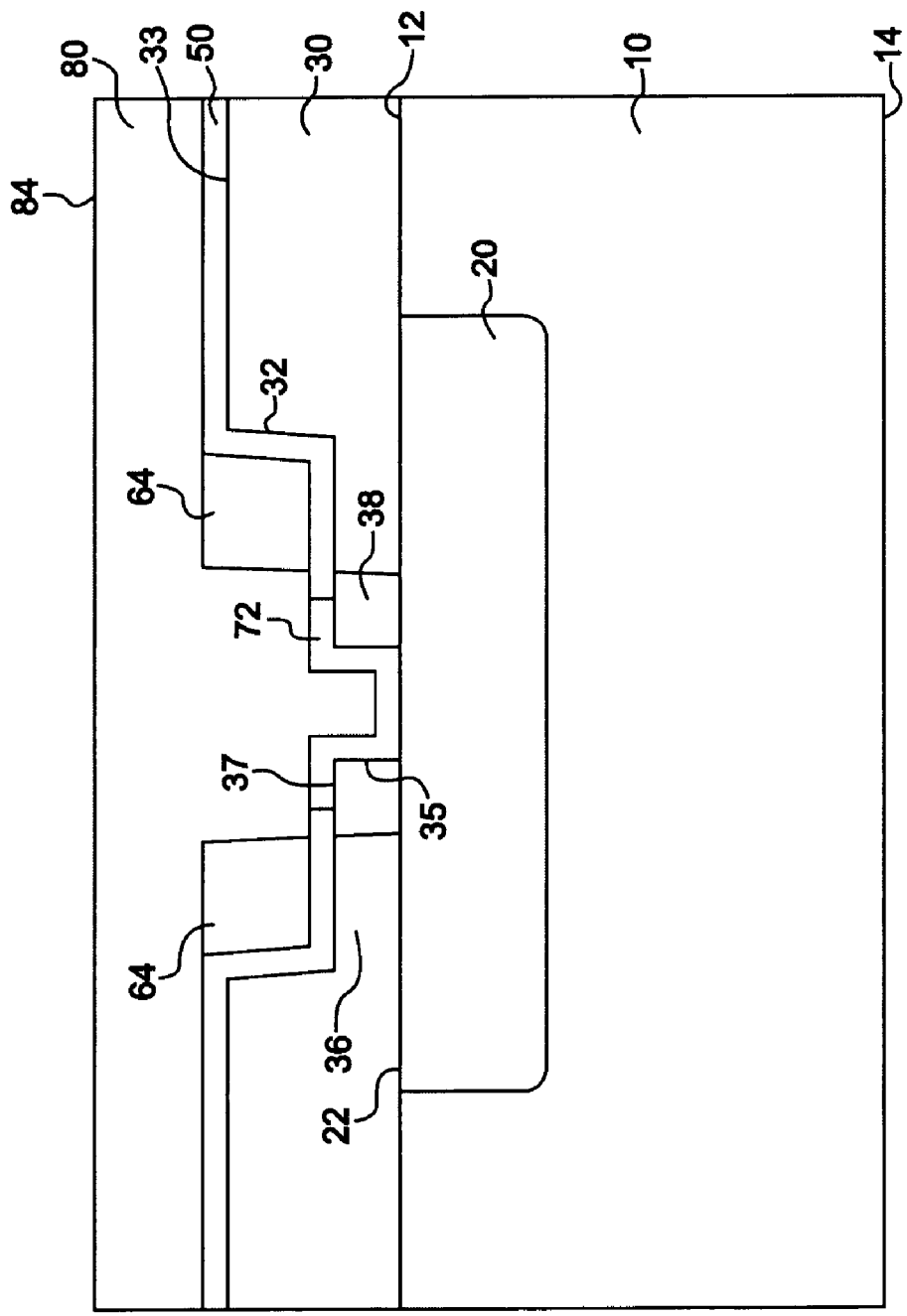
FIG. 13 illustrates a cross-section of the structure after formation of a dielectric layer.

With reference to FIG. 13, after removal of resist mask 140 shown in FIG. 12, field dielectric layer 80 which may be silicon nitride having a thickness of about 1 µm, is deposited over the entirety of the surface of the structure using PECVD for example. Field dielectric layer 80 is particularly deposited on gate oxide 50 over upper surface 33 of layer 30, on gate sections 64, and within first and second trenches 32 and 35 on metal contact 72 and gate oxide 50.

Figure 14:
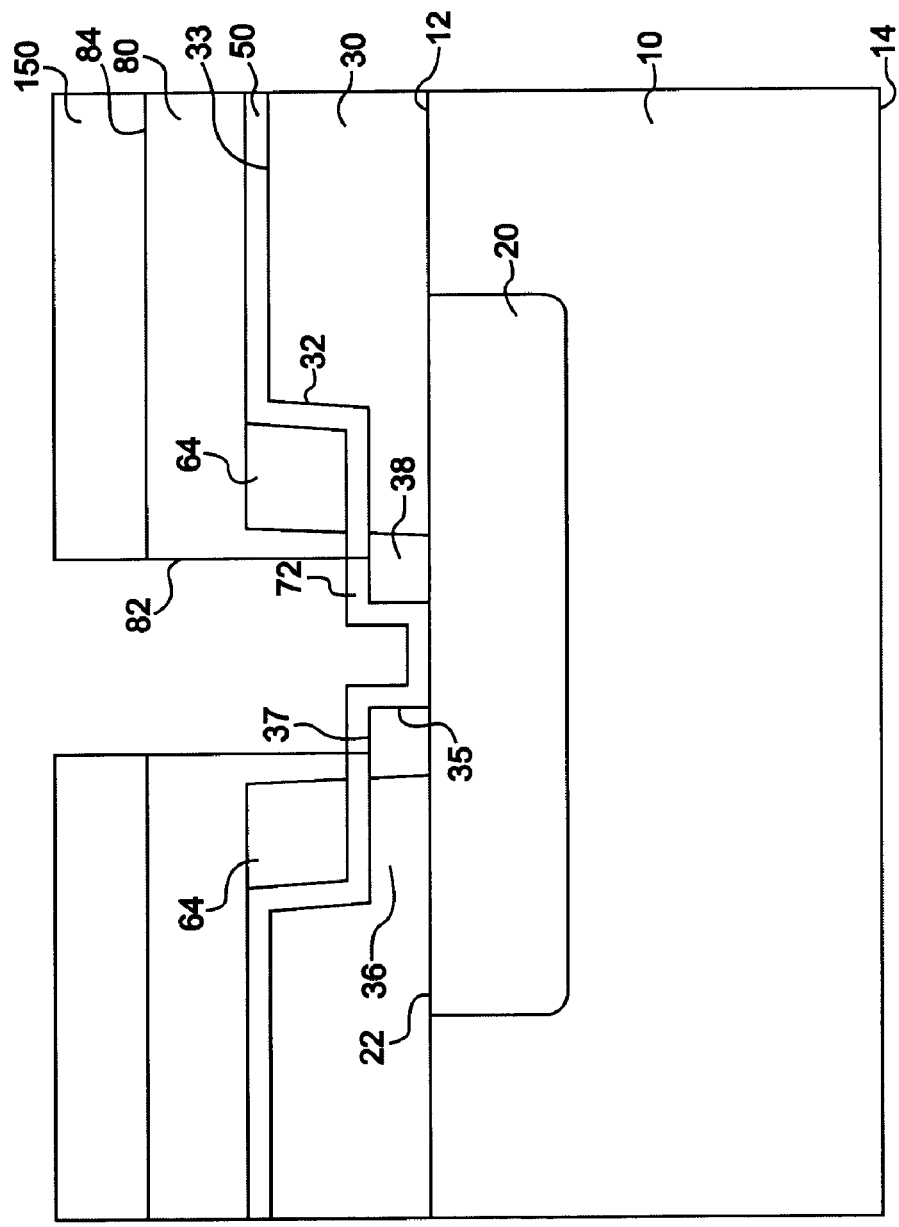
FIG. 14 illustrates a cross-section of the structure after etching of the dielectric layer to expose the source contact layer.

With reference to FIG. 14, after formation of field dielectric layer 80 as described with respect to FIG. 13, a resist layer is subsequently formed on an entirety of upper surface 84 of field dielectric layer 80. The resist layer is subsequently patterned using well-known photolithography, to form resist mask 150 as having a narrow opening aligned over metal contact 72. A dry etch such as RIE is then carried out using resist mask 150, to remove field dielectric layer 80 and to thus form trench 82 that exposes metal contact 72. Resist mask 150 is then removed.

With reference to FIG. 1, after removal of resist mask 150 as shown in FIG. 14, a metal layer is subsequently deposited over the entirety of the surface of the structure, as particularly on upper surface 84 of field dielectric 80 and to fill trench 82 on metal contact 72. The metal layer may be a single metal layer of aluminum for instance, but in the alternative may be a multilayer stack including titanium and aluminum sublayers. The metal layer as deposited on upper surface 84 of field dielectric layer 80 may have a thickness of about 1 µm. Source contact 70 is thus formed, as including metal contact 72 (not shown in FIG. 1) and source finger 74. The device is completed by depositing drain contact 90 on the preliminary drain contact layer deposited on bottom surface 14 of substrate 10, wherein drain contact 90 may also be a single metal layer of titanium or aluminum for instance, but in the alternative may be a multilayer stack including titanium and aluminum sublayers.

Although the present invention has been described in detail, the scope of the invention should not be limited by the corresponding description and figures. Although not specifically highlighted the crystal type of the silicon carbide described in this invention is assumed to be 4H, however, alternate crystal polytypes such as 6H, 15R and 3C may also be used without impacting the design or method of operation of the device described. The orientation of the crystal is such that the epitaxial layers are grown on the "Si-face" of the crystal, but alternatively may also be grown on the "C-face". Also, the concepts described above should be applicable as well for the case where the conductivity types of substrate 10 and layer 30 are reversed to be p-type, and the conductivity type of region 20 is reversed to be n-type. In this alternative case, the potentials as applied to the gate contact, the source contact and the drain contact would be inverted, as would be understood by one of ordinary skill. These various changes and modifications of the embodiments, as would become apparent to one of ordinary skill, should be considered as within the spirit and scope of the invention.

What is claimed is:

1. A semiconductor device comprising:
   a substrate of a first conductivity type;
   a region of a second conductivity type within the substrate, the region extending from an upper surface of the substrate into the substrate, the second conductivity type opposite the first conductivity type;
   a first layer of the first conductivity type over the substrate and the region;
   a trench extending into the first layer, a bottom of the trench is within the first layer and directly over the region,
   a portion of the first layer is intermediate between the bottom of the trench and the region, the portion is a current conducting channel; and
   a gate within the trench.

2. The semiconductor device of claim 1, wherein the substrate and the first layer are silicon carbide epitaxial layers.

3. The semiconductor device of claim 1, wherein the first conductivity type is n-type, and the second conductivity type is p-type.

4. The semiconductor device of claim 1, wherein the region is an implanted region.

5. The semiconductor device of claim 1, wherein the gate is polysilicon.

6. The semiconductor device of claim 1, having a gate length in a range of about 0.3 to 1.5 µm.

7. The semiconductor device of claim 1, wherein the region has a dopant concentration that is graded in the vertical direction.

8. The semiconductor device of claim 1, further comprising:
   a plurality of additional regions of the second conductivity type within the substrate, the plurality of additional regions extending from the upper surface of the substrate into the substrate;
   a plurality of additional trenches extending into the first layer and having respective trench bottoms within the first layer,
   respective portions of the first layer are intermediate between the trench bottoms and the additional regions, the respective portions are current conducting channels; and
   a plurality of additional gates within the additional trenches.

9. A vertical field effect transistor comprising:
   a first layer of a first conductivity type;
   an implanted region of a second conductivity type extending into the first layer, the second conductivity type opposite the first conductivity type;
   a second layer of the first conductivity type on an upper surface of the first layer and an upper surface of the implanted region;
   a trench extending into the second layer directly over the implanted region, a portion of the second layer is disposed intermediate between a bottom of the trench and the implanted region, the portion is a current conducting channel; and
   a gate within the trench.

10. The vertical field effect transistor of claim 9, wherein the first and second layers are silicon carbide epitaxial layers.

11. The vertical field effect transistor of claim 9, wherein the first conductivity type is n-type, and the second conductivity type is p-type.

12. The vertical field effect transistor of claim 9, wherein the gate is polysilicon.

13. The vertical field effect transistor of claim 9, wherein the implanted region has a dopant concentration that is graded in the vertical direction.

14. The vertical field effect transistor of claim 9, having a gate length in a range of about 0.3 to 1.5 µm.

* * * * *